United States Patent
Xiao et al.

(10) Patent No.: US 8,998,635 B2
(45) Date of Patent: Apr. 7, 2015

(54) JUNCTION BOX FOR PHOTOVOLTAIC MODULE

(75) Inventors: Xue-Yuan Xiao, Kunshan (CN); Hong-Qiang Han, Kunshan (CN); Zi-Qiang Zhu, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 80 days.

(21) Appl. No.: 13/542,647

(22) Filed: Jul. 5, 2012

(65) Prior Publication Data

US 2013/0010450 A1  Jan. 10, 2013

(30) Foreign Application Priority Data

Jul. 5, 2011  (CN) ...................... 2011 2 0234477 U
Jul. 5, 2011  (CN) ...................... 2011 2 0234490 U

(51) Int. Cl.
*H01R 13/00* (2006.01)
*H01L 31/048* (2014.01)

(52) U.S. Cl.
CPC ............. *H01L 31/0485* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 7,291,036 B1 * | 11/2007 | Daily et al. | 439/487 |
| 7,559,808 B2 * | 7/2009 | Nishide | 439/733.1 |
| 8,052,001 B2 * | 11/2011 | Chen et al. | 220/4.02 |
| 2010/0015821 A1 * | 1/2010 | Hsu et al. | 439/66 |
| 2010/0018572 A1 * | 1/2010 | Grimberg et al. | 136/252 |
| 2010/0218797 A1 * | 9/2010 | Coyle et al. | 136/243 |

FOREIGN PATENT DOCUMENTS

EP         2279529          2/2011
WO   WO 2009011051 A1 *  1/2009

* cited by examiner

*Primary Examiner* — Timothy Thompson
*Assistant Examiner* — Krystal Robinson
(74) *Attorney, Agent, or Firm* — Wei Te Chung; Minh Chieh Chang

(57) ABSTRACT

A junction box includes a cable connecting box, a cover covering the cable connecting box and a cable electrically connecting with the cable connecting box. The cable connecting box including an insulative box and a wire connecting module, the insulative box comprising a plurality of walls extending upwardly and a receiving cavity surround by the walls, the walls including a front wall defining a plurality of mounting holes for the cable passing through. The cover includes a plurality of separating walls extending downwardly from a peripheral of the cover to engage with the walls of the insulative box and a pretending wall being parallel to the separating wall and located in front of the front wall. The adding pretending wall provides a longer distance for the junction box to ensure a safe creepage distance for the user to use the junction box.

6 Claims, 11 Drawing Sheets

JUNCTION BOX FOR PHOTOVOLTAIC MODULE

BACKGROUND OF THE INVENTION

1. Field of the Invention

The present invention generally relates to a junction box, and more particularly to a junction box with improved safety portion.

2. Description of Related Art

U.S. Pat. No. 7,291,036B1 issued on Nov. 6, 2007 discloses a PV junction box including an insulative box, a cover covering the insulative box, a PCB (printed circuit board) received in the insulative box, a plurality of connecting foils retained in the insulative box and a plurality of diodes mounted on the PCB. The insulative box includes a plurality of walls extending upwardly from a peripheral thereof, and the cover comprises a separating wall extending downwardly from a peripheral thereof and abutting against the walls of the insulative box along an horizontal direction. Two through holes are defined in a front wall of the walls of the insulative box for outside cables passing therethrough to electrically connecting with the contacting foils. A distance from the inside of the insulative box to the outside of the insulative box is the same as a thickness of the separating wall and the front wall together, adding a height of the separating wall overlapping the front wall. By this arrangement, the distance can not ensure a safe creepage distance for the user to use the junction box.

Hence, an improved junction box is desired to overcome the above problems.

SUMMARY OF THE INVENTION

An objector of the invention is to provide a junction box with improved safety portion.

According to one aspect of the present invention, a junction box comprises a cable connecting box, a cover covering the cable connecting box and a cable electrically connecting with the cable connecting box. The cable connecting box including an insulative box and a wire connecting module, the insulative box comprising a plurality of walls extending upwardly and a receiving cavity surrounded by the walls, the walls including a front wall defining a plurality of mounting holes for the cable passing through. The cover includes a plurality of separating walls extending downwardly from a peripheral of the cover to engage with the walls of the insulative box and a pretending wall being parallel to the separating wall and located in front of the front wall.

Other objects, advantages and novel features of the present invention will become more apparent from the following detailed description of the present embodiment when taken in conjunction with the accompanying drawings.

DETAILED DESCRIPTION OF THE INVENTION

Figure 1:
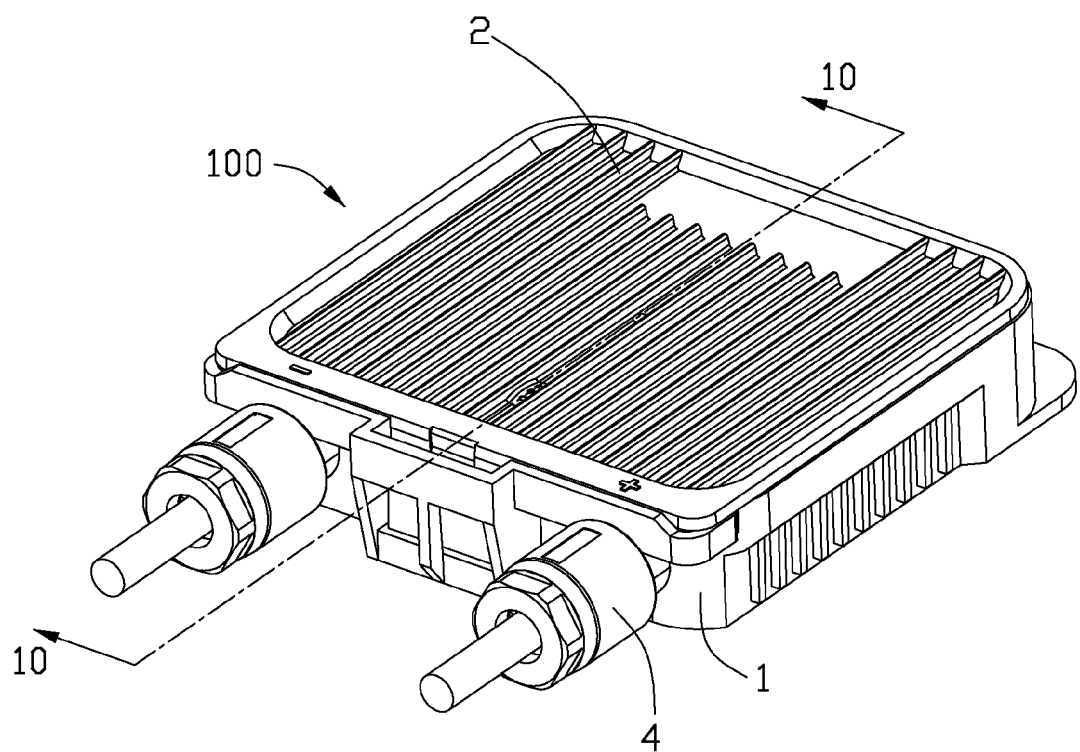
FIG. 1 is an assembled perspective view of a junction box according to a preferred embodiment of the present invention.
Figure 2:
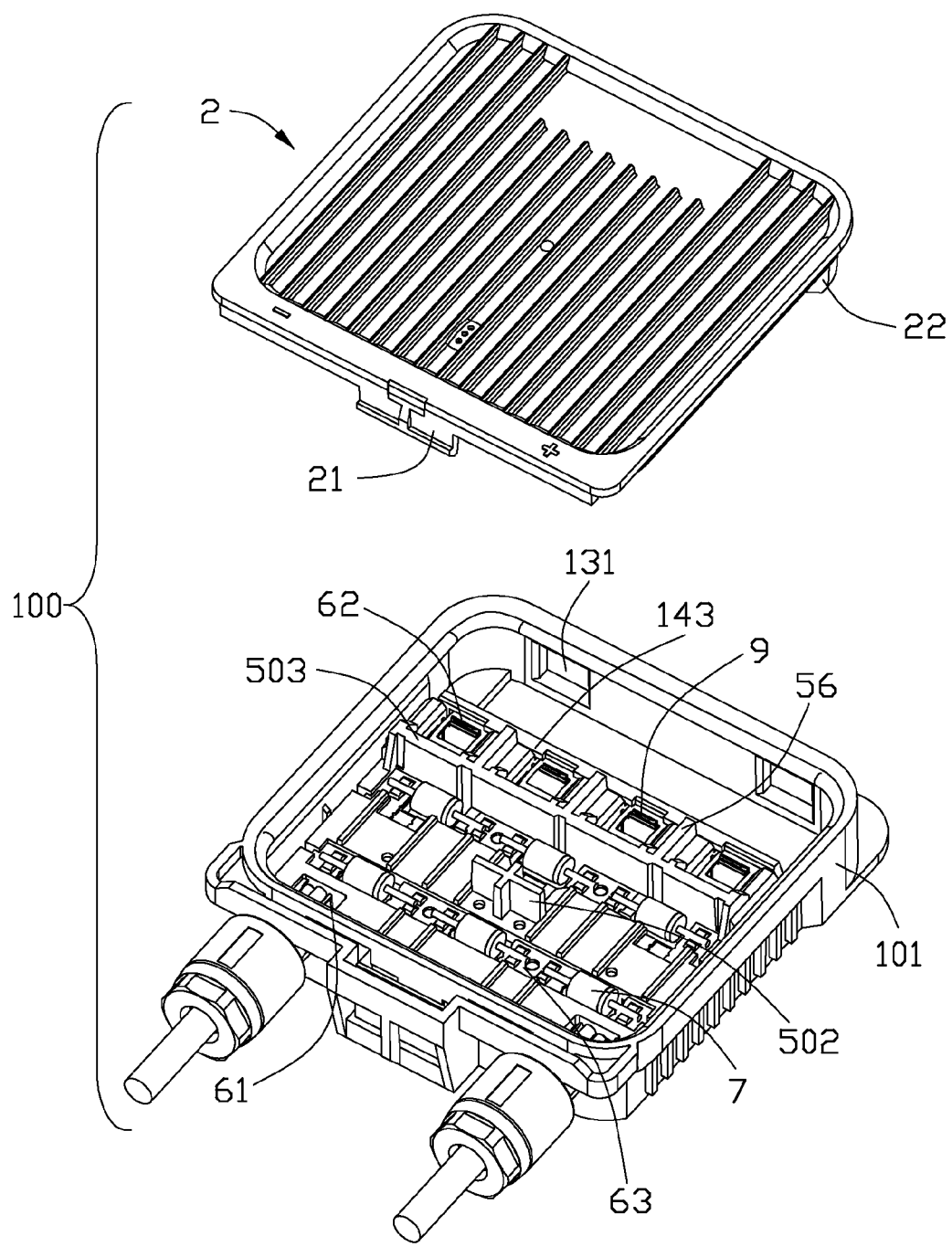
FIG. 2 is another assembled perspective view of the junction box according to the present invention, but taken from another view, which discloses the cover separated from a cable connecting box.

Reference will now be made to the drawing figures to describe the preferred embodiment of the present invention in detail.

Referring to FIGS. 1-11, a junction box 100 used for electrically connecting a photovoltaic (PV) module (not labeled) and transmitting electrical current according to the present invention is disclosed. The junction box 100 includes a cable connecting box 101, a cover 2 covering an upper side of the cable connecting box 101 and a cable 4 connecting with the cable connecting box 101. The cable connecting box 101 includes a plastic insulative box 1 and a wire connecting module 3 attached to the insulative box 1.

Figure 3:
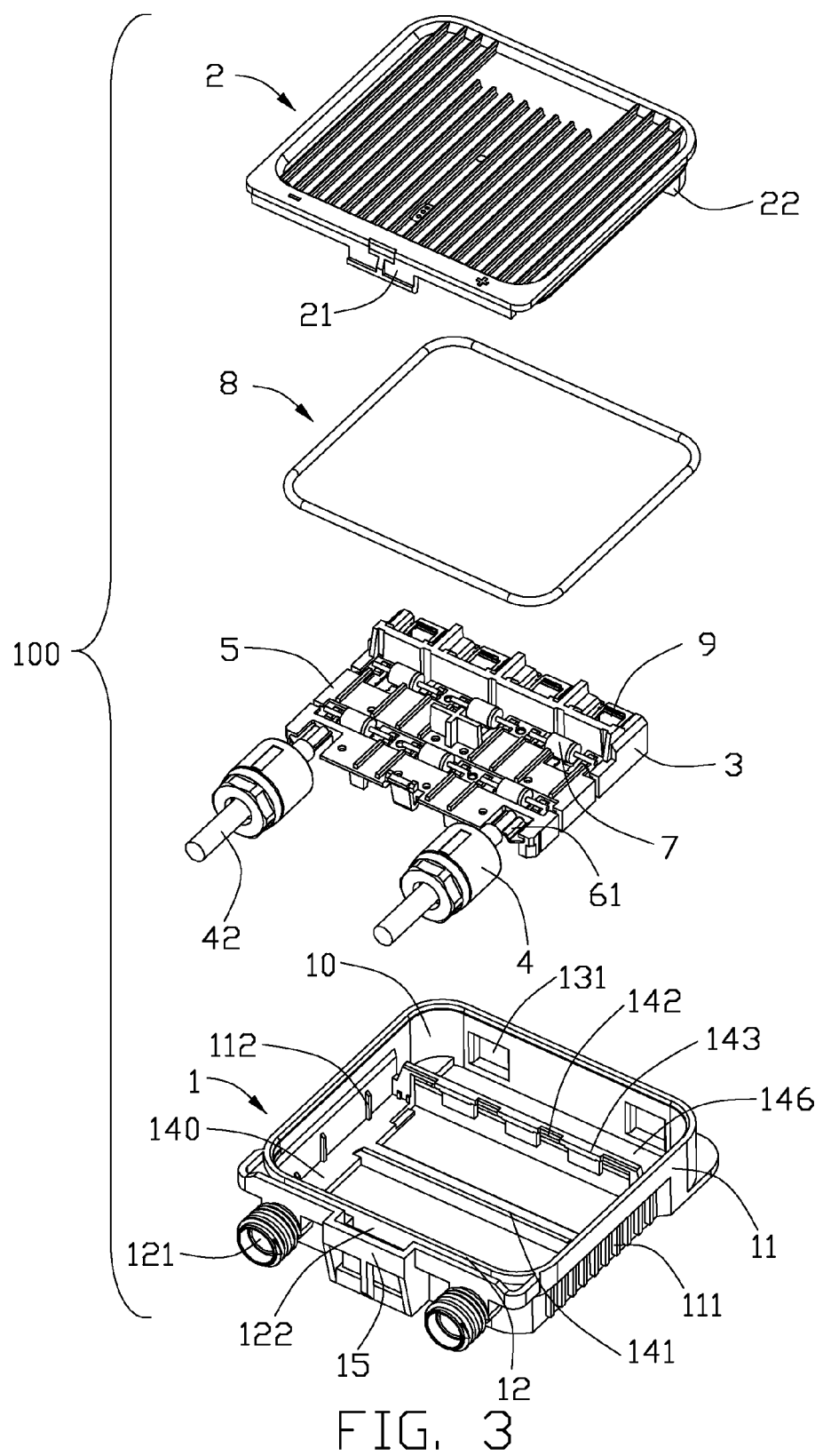
FIG. 3 a partly exploded perspective view of the junction box with a cover separated from the cable connecting box.
Figure 4:
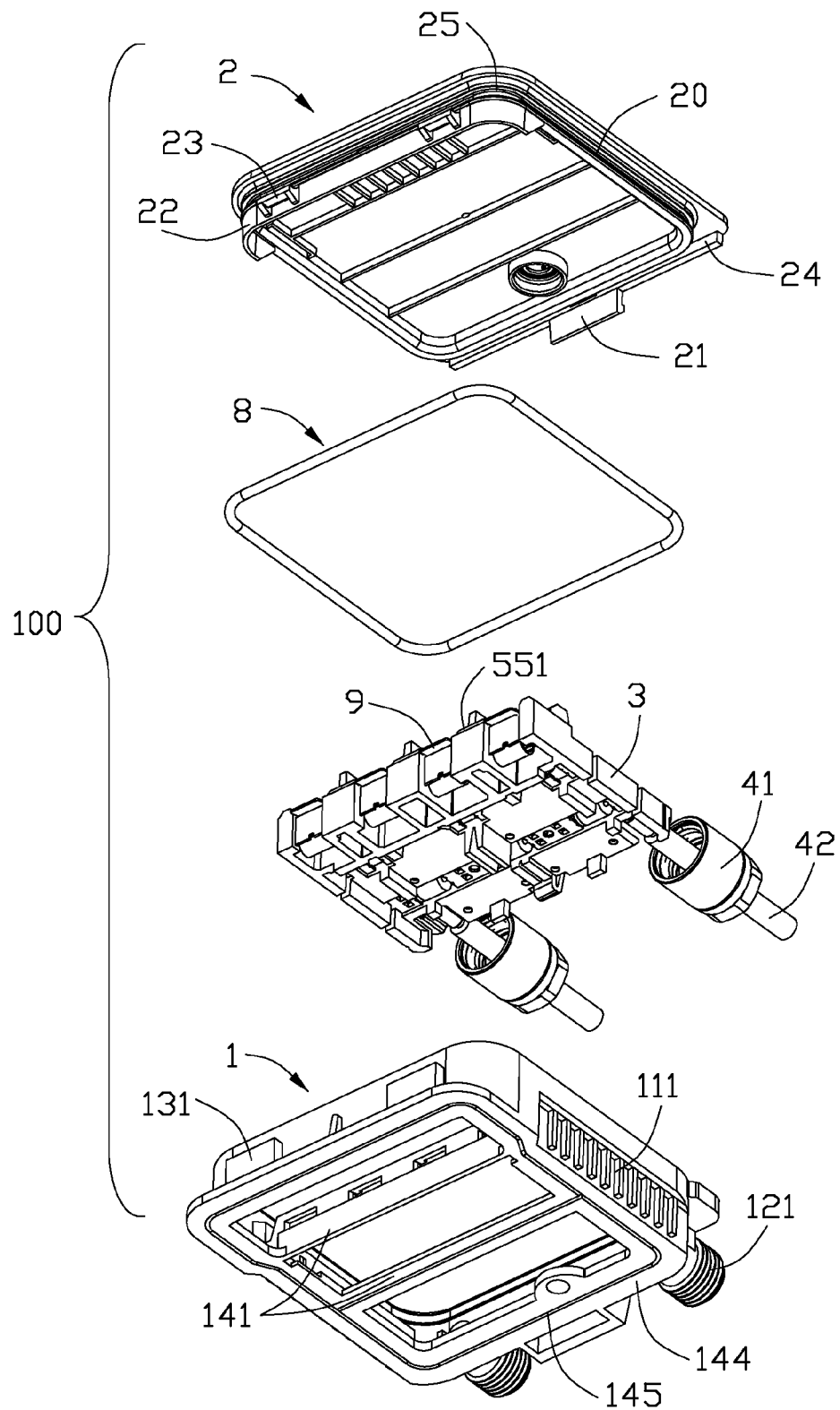
FIG. 4 is similar with FIG. 3, but taken from another view.
Figure 5:
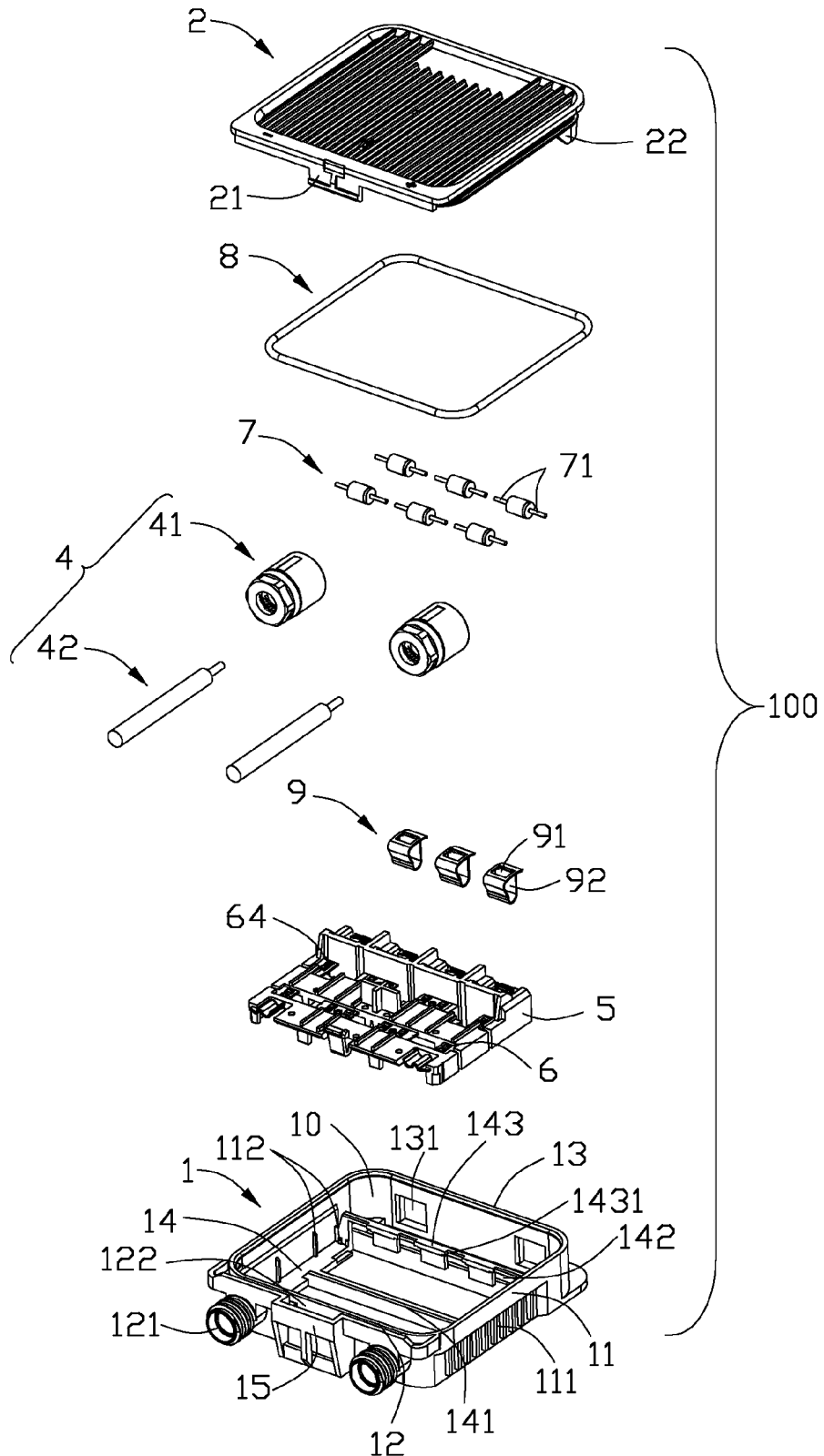
FIG. 5 is an exploded perspective view of the junction box.
Figure 6:
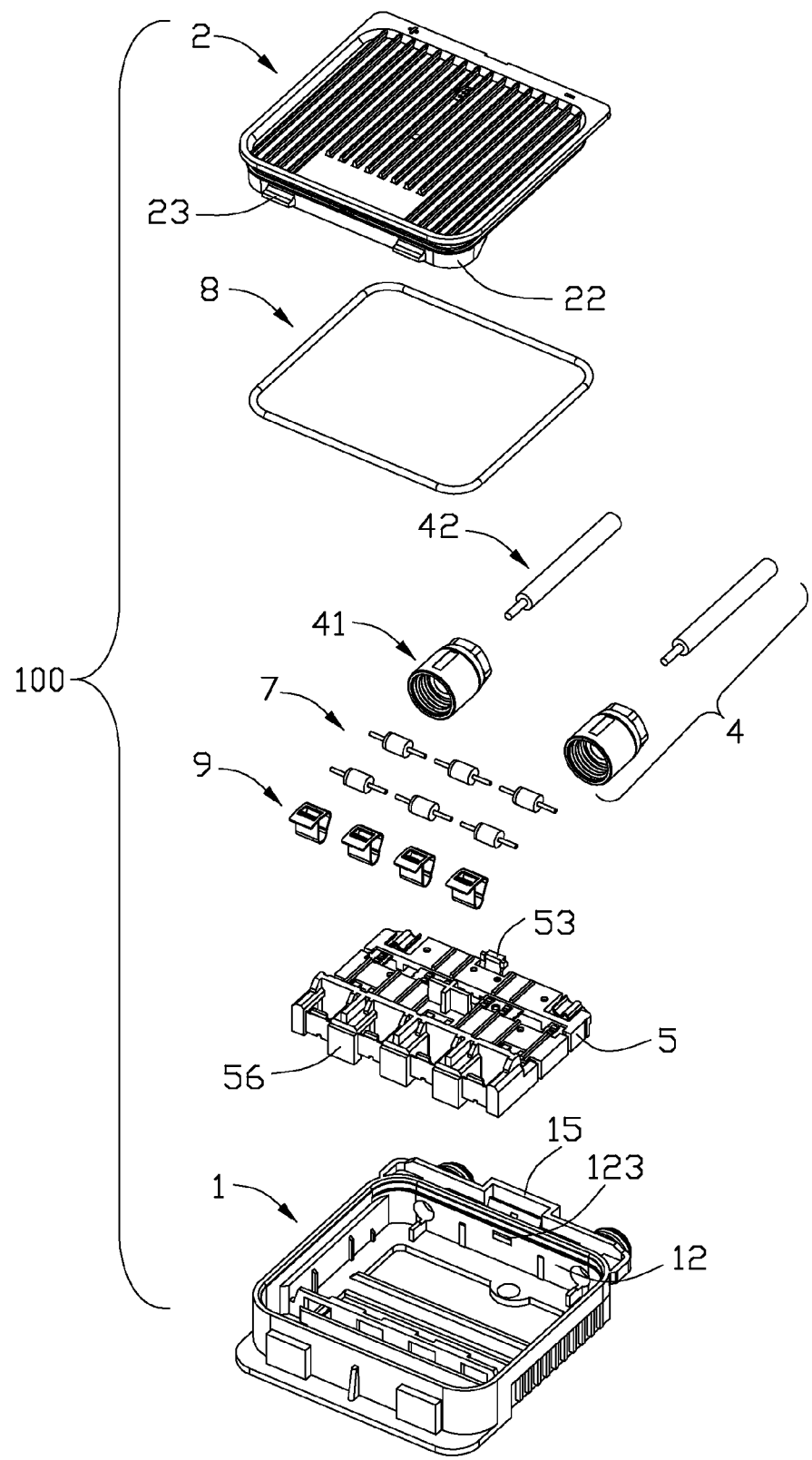
FIG. 6 is similar with FIG. 5, while taken from a different aspect.
Figure 7:
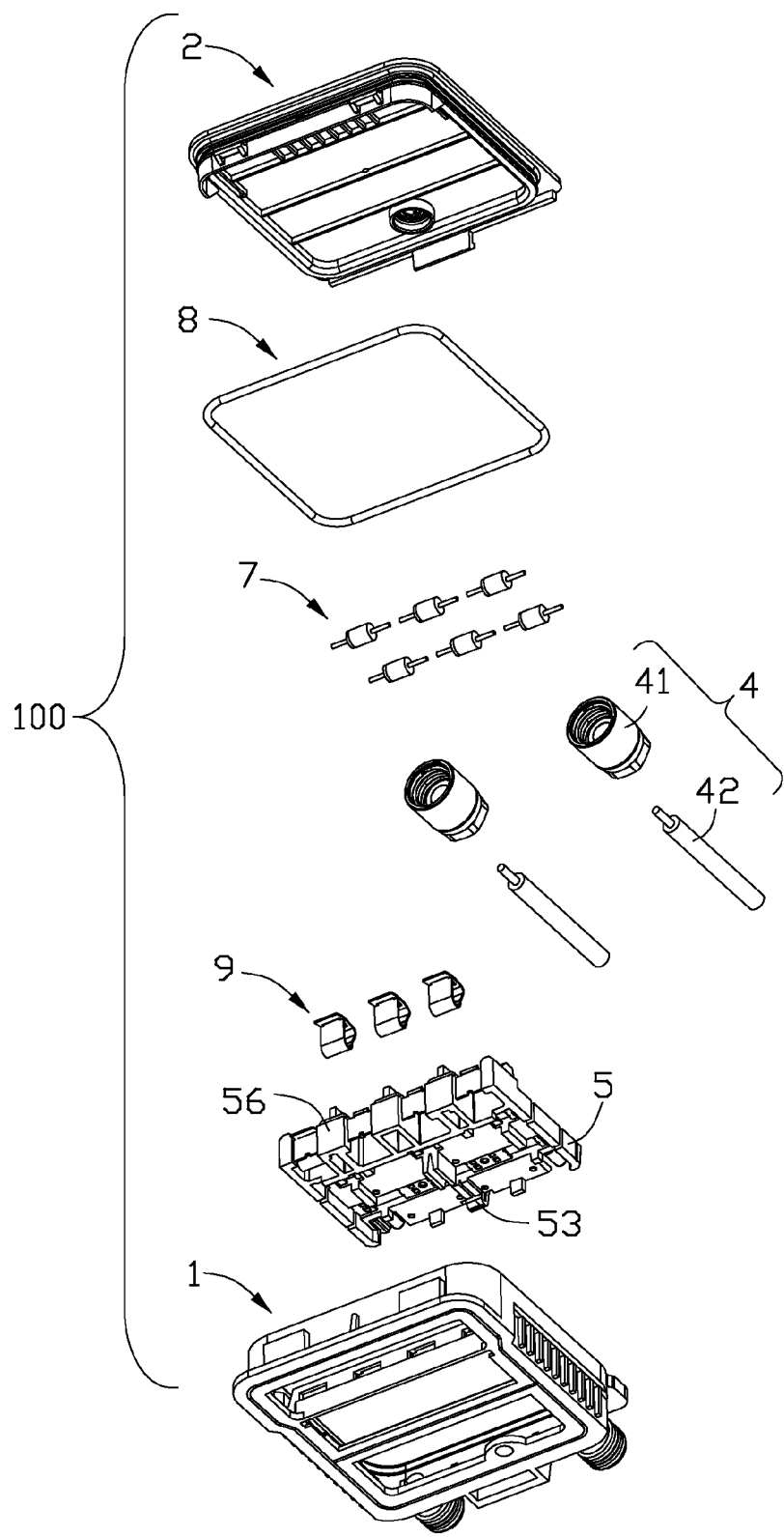
FIG. 7 is similar with FIG. 6, while taken from another different aspect.
Figure 8:
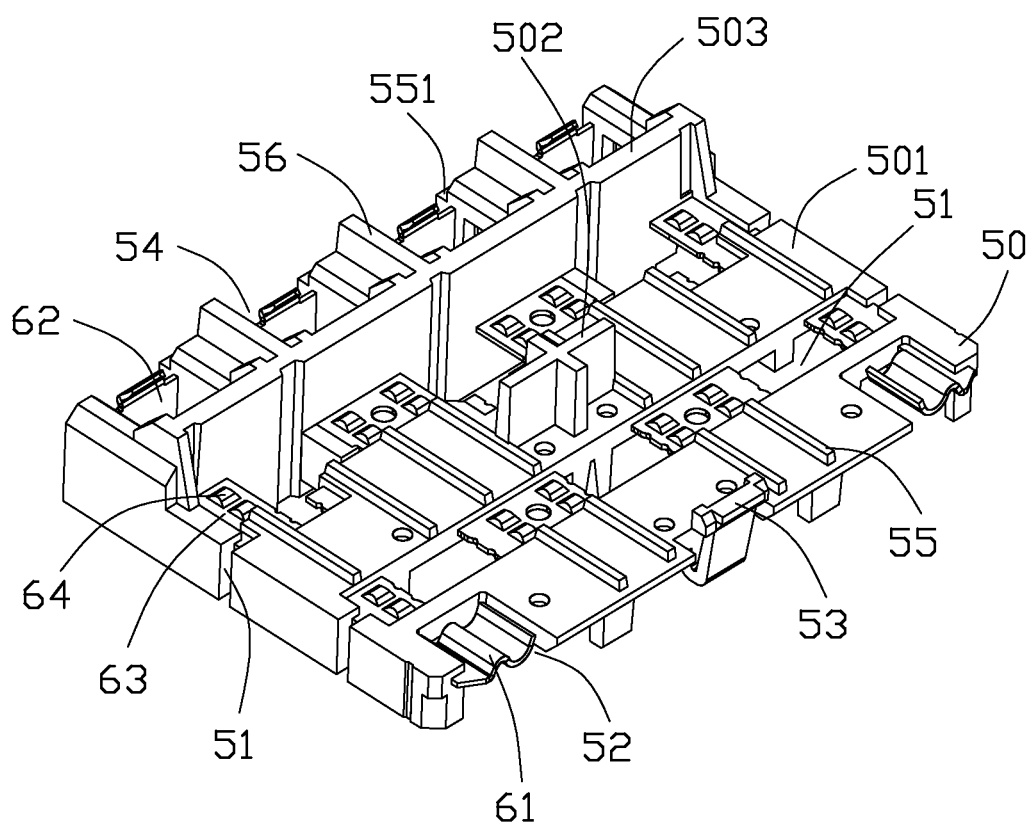
FIG. 8 is a perspective view of a wire connecting module of the junction box.

Please refer to FIGS. 3-4, the wire connecting module 3 includes a insulative block 5 presented as a rectangular shape, a plurality of metal contacting foils 6 and a plurality of diodes 7 connecting with two neighborly contacting foils 6.

Please refer to FIGS. 4-8, the insulative block 5 has a body portion 50 approximately shaped as a rectangular plate, a plurality of hollows 51 extending through the body portion 50 along an up-to-down direction. The body portion 50 has a top face 501 facing the cover 2 and a plurality of ribs 55 protruding upwardly from the top face 501.

In present invention, the insulative block 5 has two such hollows 51 arranged along a front-to-back direction. The insulative block 5 is divided into three portions along the front-to-back direction by the hollows 51, which extend along a transverse direction vertical to the front-to-back direction of the body portion 50. The first portion of the body portion 50 is formed with a pair of first escaping portions 52 at two sides of a front end thereof and a hook 53 at a middle of the front end thereof. The first escaping portions 52 extend through the body portion 50 along the up-to-down direction. The hook 53 extends forwardly and downwardly, then bents upwardly from the middle of the body portion 50. By this arrangement, the hook 53 may has a better resilient property to be removed easily.

The second portion of the body portion 50 includes a supporting portion 502 extending upwardly from the top surface 501 to support the cover 2. The third portion of the body portion 50 has a fence 503 extending along the transverse direction and located at a rear of the second portion, and a plurality of second escaping portions 54 recessed forwardly from a rear edge thereof. Each two adjacent second escaping portions 54 has a separating wall 56 therebetween. The separating wall 56 defines a plurality of depressions 551 at a top of a rear end of the separating plate 56. The ribs 55 extend along the front-to-back direction and are distributed uniformitily on the top face 501 to enlarge an area for heat dissipation. The ribs 55 are parallel to each other. The ribs 55 provide a lager area for the junction box 100 heat dissipate timely.

The contacting foils 6 have a plurality of connecting portions 61 connecting with the cable 4 and received in the first escaping portions 52, a plurality of base portions mostly insert-molded in the body portions 50 and extending backwardly along a mating direction of the cable 4, and a plurality of contacting portions 62 extending backwardly from the base portion and connecting with the photovoltaic module. The base portions further have a plurality of soldering portions 63 exposed in the hollows 51. The soldering portions 63 have a plurality of embosses 64 protruding upwardly, each soldering portion 63 has a pair of embosses 64.

The junction box 100 further has a plurality of clamp springs 9 for clamping the contacting portions 62 of the contacting foils 6 and a plurality of contacting plates (not labeled) of the photovoltaic module. One end of the clamp spring 9 defines a through hole 91, the other end of the clamp spring 9 has a tab 92 with a width of the tab 92 smaller than that of a body of the clamp spring 9. The tab 92 extends through the through hole 91, and the contacting portion 62 is clamped between the tab 92 and an inner wall of the through hole 91. Insert the contacting plate of the photovoltaic module into an area between the tab 92 and the inner wall of the through hole 91 and be clamped by the tab 92 and the inner wall of the through holes 91 to electrically connect the junction box 100 with the photovoltaic module.

Each of the diodes 7 has a pair of tails 71 extending outwardly from two sides thereof, each tail 71 is soldered between two adjacent embosses 64 of the soldering portions 63.

Please refer to FIGS. 1-7, and FIG. 10, the insulative box 1 presents as a rectangular box, including two side walls 11, a front wall 12 and a rear wall 13 connecting the two side walls 11, a receiving cavity 10 surrounding by the side walls 11, the front wall 12 and the rear wall 13. The insulative box 1 further comprises a bottom wall 14 located under the receiving cavity 10 and a supporting portion 15 connecting with two side walls 11 and located in front of the front wall 12. The supporting portion 15 presents as a T shape. The front wall 12 defines two side by side mounting holes 121 with exterior thread, from which the cable extending through to connect with the connecting portions 61. The mounting holes 121 are located under the supporting portion 15. A locking slot 122 is defined between the supporting portion 15 and the front wall 12 and opening upwardly, and a resilient locking portion 151 is formed in the locking slot 122. Please refer to FIGS. 10-11, the resilient locking portion 151 is extending upwardly from a bottom of the looking slot 122. A depressing slot 123 is recessed from a surface facing to the receiving cavity 10 for locking with the hook 53 of the insulative block 5. Please refer to FIG. 6, the hook 53 and the depressing slot 123 engage with each other, when the insulative block 5 is damaged, the user can remove the insulative block 5 away from the junction box 100 by levering the hook 53. So, the junction box 100 can be partly replaced to save cost. The two side walls 11 have a plurality of ribs 111 extending along the up-to-down direction on outsides of the side walls 11 to enlarge an area for heat dissipation. A plurality of position blocks 112 extend inwardly along the up-to-down direction on insides of the side walls 11 to engage with the insulative block 5.

The rear wall 13 defines two locking holes 131 extending through thereof along a front-to-back direction. The bottom wall 14 has a plurality of windows (not labeled) and two bridges 141 extending along a transverse direction between the windows and being parallel to each other. One of the bridge 141 closed to the rear wall 13 defines a plurality of openings 142 extending therethrough along a front-to-back direction and arranged side by side, the bridge 141 further has an pressing portion 143 located between two neighborly openings 142 to engage with the depression 551. A passageway 146 is formed between the bridge 141 near to the rear wall 13 and the rear wall 13 for the contacting plates of the photovoltaic module inserting into. Two sides of the pressing portion 143 extend outwardly till the opening 142 to from a pair of engaging portions 1431 to abut against a free end of the clamp spring 9 with the through hole 91 to prevent the clamp spring 9 from loosing. The bottom wall 14 defines an inner face 140, a mounting face 144 opposite to the inner face 140 and a slit 145 depressing from the mounting face 144 for the users coat adhesive and retain the junction box 100 to a PV plate, the slit 145 is shown in a circle surrounding in the mounting face 144. The slit 145 can absorb much more glue which is used to stick the junction box 100 to the PV module to get a well combination.

Figure 9:
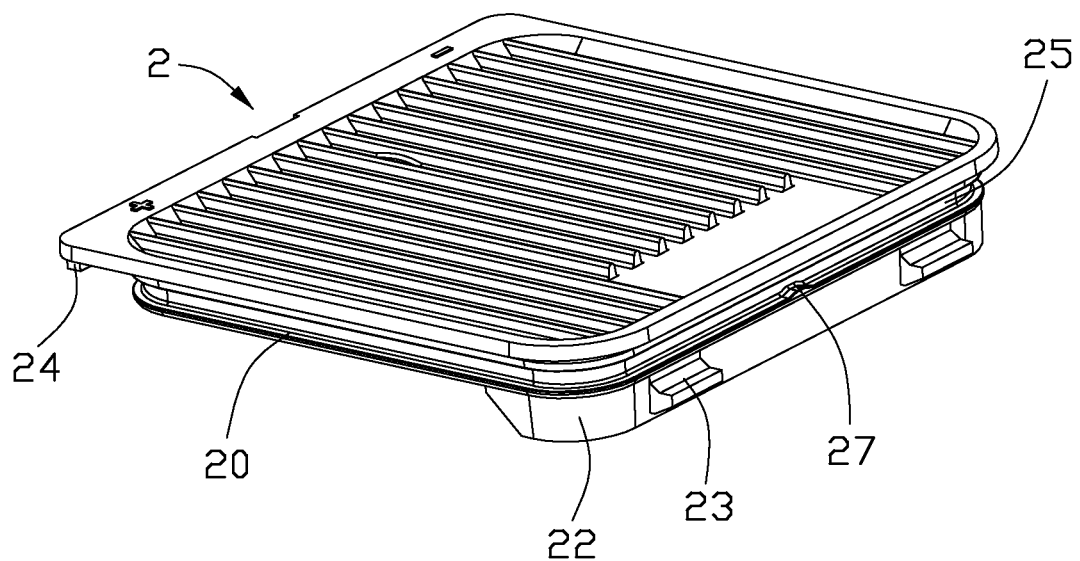
FIG. 9 is a perspective view of a cover of the junction box.
Figure 10:
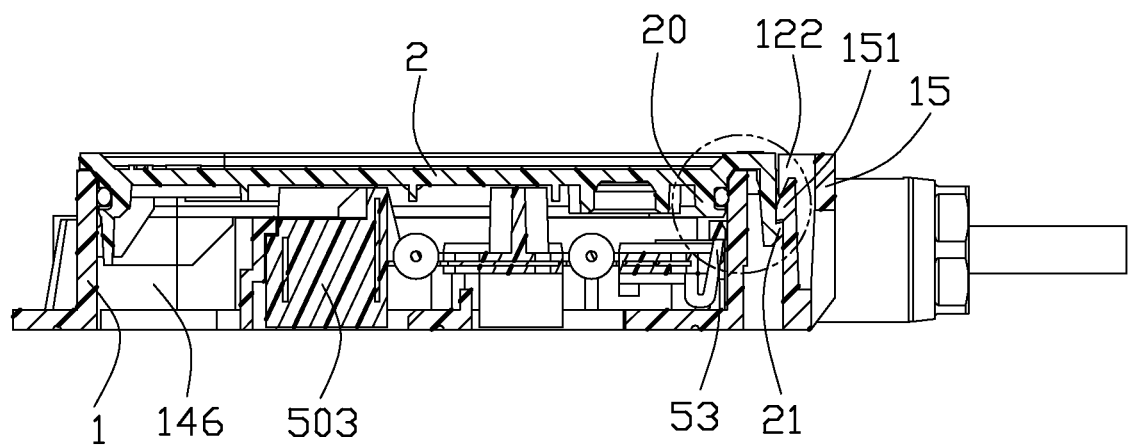
FIG. 10 is a cross-sectional view of the junction box taken along line 10-10 of FIG. 1.
Figure 11:
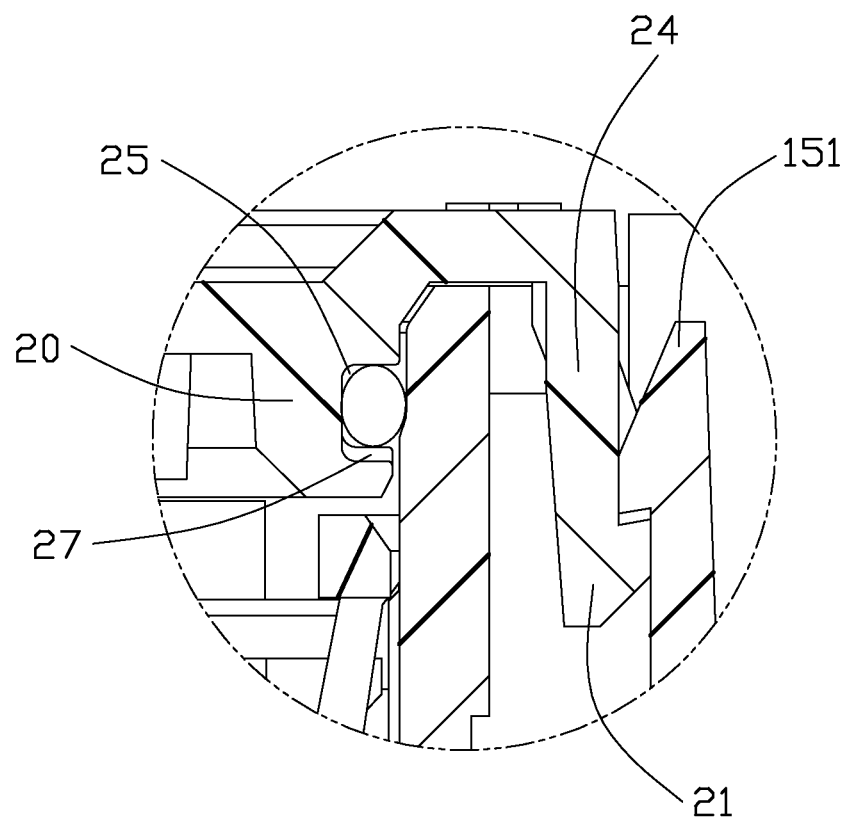
FIG. 11 is an enlarged view of the junction box in a circuit map to FIG. 10.

Please reference to FIGS. 9-11, the cover 2 comprises a separating wall 20 extending downwardly from peripheral of the cover, the separating walls connect with each other and abut against with an inner wall of the insulative box 1. The cover 2 further comprises a pretending wall 24 extending downwardly form a front side of the cover 2 and being parallel to the front wall 12 of the insulative box 1. The pretending wall 24 is located between the front wall 12 and the supporting portion 15. In the present invention, the junction box 100 not only comprises a separating wall 20 and a front wall 12 but also comprising a pretending wall 24 which can increase a distance of the inside to outside electrical clearance and creepage distance when the junction box 100 is installed and used. The cover 2 further comprises a latching portion 21 to locking with the resilient locking portion 151 of the insulative box 1. The latching portion 21 also can be set as a slot or a resilient finger. In the present invention, the latching portion 21 is a resilient finger locking with the resilient locking portion 151, and the pretending wall 24 is mostly received in the locking slot 122, a top face of the cover 2 and a top surface of the supporting portion are coplanar to prevent user to open the junction box only by hands. When the contacting portions 62 of the contacting foils 6 connect with the exterior contacting plates of the PV module in the passageway 146, for the contacting plates are easy to bent and may touch the inner wall of the insulative box 1 for its soft feature. A preventing blade 22 extends downwardly from a rear end of the cover 2 to provide an inner wall thereof for the contacting plates depending on, so a height of the preventing blade 22 can increase a safe creepage distance for the junction box 100. The preventing blade 22 further has a plurality of protrusions 23 extending backwardly to lock with the locking holes 131 of the rear wall 13. Understandably, the protrusion 23 can be formed on the rear wall 13 of the insulative box and the locking hole 131 can be formed in the preventing blade 22 alternatively. The separating wall 20 defines a sealing slot 25 along its outside surfaces. An o-ring 8 mounted in the sealing slot 25 seals the insulative box 1 when the cover 2 covers the insulative box 1 to prevent water flowing into an inner side of the junction box 100. The o-ring 8 is made of silicone or plastic materials and is formed in a rectangular circuit configuration. The sealing slot 25 has a tuber 27 at a place of the mold commissure of the cover 2 to enlarge a deformation of the o-ring 8. The tuber 27 extends into the sealing slot 25 from a bottom face thereof.

The cables 4 include two nuts 41 with interior thread and two wires 42 extending through the nuts 41 along a front-to-back direction. The interior threads of the nuts 41 match to the exterior threads of the mounting holes 121. The wires 42 insert into the insulative box 1 through the mounting holes 121 and electrically connect with the connecting portions 61 of the contacting foils 6 through the mounting holes 121, to finally position the cables to the insulative box 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A junction box assembly comprising:

a cable connecting box having an insulative box and a wire connecting module, the wire connecting module having an insulative block, a plurality of contacting foils retained in the insulative block and a plurality of diodes connecting with every two neighbor contacting foils:

a cover covering the insulative box, the cover having a separating wall extending downwardly from a periphery of the cover and a preventing blade extending downwardly from a rear side of the separating wall, a protrusion formed on one of the preventing blade and the insulative box, and a locking hole formed in the other of said preventing blade and the insulative box to lockably receive said protrusion;

a latch portion formed on a front side of the separating wall to cooperate with the protrusion to symmetrically secure the cover to the insulative box; and a cable connecting with the contacting foils.

2. The junction box assembly as claimed in claim 1, wherein the protrusion is formed on the preventing blade and the locking hole is formed in the insulative box.

3. The junction box assembly as claimed in claim 1, wherein said latching portion is resilient.

4. The junction box assembly as claimed in claim 1, wherein said latching portion is formed on a pretending wall which is spaced from and in front of the separating wall.

5. The junction box assembly as claimed in claim 1, wherein said protrusion and said locking hole are hidden from an exterior.

6. The junction box assembly as claimed in claim 5, wherein said insulative box defines a supporting portion to protectively hide the latching portion therebehind.

* * * * *